US006628566B2

United States Patent
Jeong

(10) Patent No.: US 6,628,566 B2
(45) Date of Patent: Sep. 30, 2003

(54) SYNCHRONOUS SEMICONDUCTOR MEMORY DEVICE FOR CONTROLLING CELL OPERATIONS BY USING FREQUENCY INFORMATION OF A CLOCK SIGNAL

(75) Inventor: Jeong Su Jeong, Seoul (KR)

(73) Assignee: Hynix Semiconductor Inc., Ichon (KR)

( * ) Notice: Subject to any disclaimer, the term of this patent is extended or adjusted under 35 U.S.C. 154(b) by 0 days.

(21) Appl. No.: 10/060,082

(22) Filed: Jan. 31, 2002

(65) Prior Publication Data

US 2002/0163851 A1 Nov. 7, 2002

(30) Foreign Application Priority Data

May 3, 2001 (KR) ........................................ 2001-24100

(51) Int. Cl.[7] ................................................. G11C 7/00
(52) U.S. Cl. .................................. 365/230.06; 365/233
(58) Field of Search ............................ 365/230.06, 233

(56) References Cited

U.S. PATENT DOCUMENTS

| 4,685,614 | A |   | 8/1987  | Levine .......................... 236/78 |
| 5,784,332 | A |   | 7/1998  | Zheng et al. ................. 365/233 |
| 5,883,853 | A |   | 3/1999  | Zheng et al. ................. 365/233 |
| 5,914,902 | A |   | 6/1999  | Lawrence et al. ........... 365/201 |
| 5,933,379 | A |   | 8/1999  | Park et al. ................... 365/201 |
| 5,956,289 | A |   | 9/1999  | Norman et al. ............. 365/233 |
| 5,982,238 | A |   | 11/1999 | Söderquist ...................... 331/2 |
| 6,078,636 | A | * | 6/2000  | Shirai et al. ................... 377/26 |
| 6,341,089 | B1 | * | 1/2002  | Sawada et al. ............. 365/191 |
| 6,438,063 | B1 | * | 8/2002  | Lee ........................ 365/230.03 |

FOREIGN PATENT DOCUMENTS

| JP | 5 101697  | 4/1993 | ........... G11C/29/00 |
| JP | 2000-48588 | 2/2000 | ........... G11C/17/00 |

OTHER PUBLICATIONS

Betty Prince, "Semiconductor Memories", 1983, Wiley, 2nd edition, pp. 467–472.*

* cited by examiner

Primary Examiner—Michael Tranh Tran
(74) Attorney, Agent, or Firm—Jacobson Holman PLLC

(57) ABSTRACT

The synchronous semiconductor memory device includes a frequency information generating circuit for outputting a plurality of frequency information corresponding to the frequency of the clock signal in response to a state control signal and an internal address in order to adjust a point of time to disable and precharge a word line by a frequency information corresponding to a frequency of a clock signal. Therefore, even though a high frequency clock signal is inputted, the word line is disabled and precharged when a cell node is charged enough. In this way, it can prevent from failing cell operations and promotes operation efficiency of the synchronous semiconductor memory device.

12 Claims, 5 Drawing Sheets

SYNCHRONOUS SEMICONDUCTOR MEMORY DEVICE FOR CONTROLLING CELL OPERATIONS BY USING FREQUENCY INFORMATION OF A CLOCK SIGNAL

FIELD OF THE INVENTION

The present invention relates to the field of a synchronous semiconductor memory device, and more particularly to a synchronous semiconductor memory device capable of controlling cell operations by utilizing frequency information of a clock signal.

The synchronous semiconductor memory device is operable without failure even though a high frequency clock signal is inputted thereto since the time of a word line to be disabled and precharged is established in response to frequency information of the clock signal.

BACKGROUND OF THE INVENTION

A synchronous semiconductor memory device generally synchronizes all of input/output signals with clock signals, and perform for the input/output operation of data by using an input/output register.

The operation of the synchronous semiconductor memory device will be described hereinafter. First, in a read-out operation, at a rising edge of a clock signal, a row address strobe signal /RAS is generated from a chip selection signal /CS, and a row address is admitted to be input into the memory device in response to the /RAS. Then, a word line corresponding to the row address is selected. Further, data of a memory cell connected to the selected word line is loaded on each bit line, and data loaded on the bit line is sensed and amplified by a sense amplifier. A column address is inputted thereto in response to a column address strobe signal /CAS activated at the next rising edge of the clock signal, and the amplified data loaded on a bit line selected by a column decoder is transferred to a data bus. The amplified data on the data bus is stored in the input/output register, and turned out of the memory device in synchronously response to the clock signal CLK.

Meanwhile, in a write-in operation, at a rising edge of a clock signal, the row address strobe signal /RAS is generated from a chip selection signal /CS, and a row address is inputted into the memory device in accordance with an activation of the /RAS. Then, a word line corresponding to the row address is selected. At this time, data is supplied from an external source thereto, and the data stored in an input/output register in synchronism with the clock signal is loaded on a data bus. Further, as a column address is inputted in accordance with a column address strobe signal /CAS activated at the next rising edge of the clock signal, the data on data bus is transferred to the bit line selected by a column decoder. The data transferred to the bit line is stored in a memory cell connected to the selected word line.

With a function of the input/output register, it is possible to control internal operations such as precharging, as synchronized with the clock signal CLK, thereby ensuring a high-speed operation.

Every operation mode of the synchronous semiconductor memory device is setting in accordance with a combination of command signals indicative of states of the operation modes but not predetermined voltage levels of a specific signal. The command signals are conductive synchronously with a clock signal.

Since one operation is executed through several clock cycles, each cycle of the clock signal is assigned to a specific operation state. That is, the operation of the synchronous semiconductor memory device is composed of a plurality of operation states each associated with one of operating cycles of the clock signal. Therefore, in each clock cycle, a finite state machine is necessary to designate a specific state, and the finite state machine receiving input signals /CAS, /RAS, /CS, /WE etc and a clock signal CLK designate a following operation.

If control signals such as the row address strobe signal /RAS and the column address strobe signal /CAS et al are enabled during only one cycle of the clock signal, the operation states are stored in an internal register and the stored operation states are maintained the current input states until new valid address signals are applied thereto. Therefore, an operation state of a chip is determined by combination of the external signals /CS, /RAS, /CAS, and /WE etc applied with much as a pulse width as same as that of the clock signal. The operation state is decoded by a command signal decoder in the chip, and command signals corresponding to the operation state are generated, and thereby chip operations are carried out in response to the command signals.

The read operation will be now explained. At a rising edge of the clock signal, a word line enable command signal ACT and the row address are activated, and a semiconductor memory device sets an active state. At this time, a specific word line is selected by the row address.

Then, if a read command signal and a column address are admitted to be input into the memory cell, the data on the bit line amplified by the sense amplifier is supplied to the data bus, and the data stored in the input/output register in synchronously response to the clock signal CLK is turned out of the memory device.

Here, a time interval between input of the read command signal and output of a valid data is CAS latency CL. The value of the CAS latency CL is established with the integer times of the clock cycle. After the CAS latency CL from input of the read command signal, specified numbers of data are successively generated, and the numbers are equal to a burst length BL. After data as many as the burst length BL is processed, the operation state is automatically established to precharge which is an auto precharge. A generation of an auto prechrge command signal APCG response to a burst end command signal BEND, enters into the auto precharge operation.

The write-in operation will be now explained. At a rising edge of the clock signal, the word line enable command signal ACT and the row address are inputted into the memory device, and the semiconductor memory device is established to an active state. At this time, a specific word line is selected by the row address. Further, if a write command signal and a column address strobe signal are supplied, the data stored in the input/output register in synchronously response to the clock signal CLK is transferred to a data bus, and the data is transferred to a bit line corresponding to the column address, and thereby the data is stored in a memory cell connected to the selected word line.

The precharge state is automatically established by an auto precharge command signal after reading the data as many as burst length BL.

However, in case that a high frequency clock signal is applied, since the read-out and write-in operations are performed in accordance with a cycle set in advance by a parameter, the read-out and write-in operations are progressed when a potential of cell node CN is not high enough. Thus, it is impossible to read out or write in the valid data, thereby to cause to fail cell operations.

SUMMARY OF THE INVENTION

The object of the present invention is to prevent a failure in cell operations by setting up a point of time when a word line may be disabled in accordance with the stored frequency information.

Another object of the present invention is to prevent a failure in cell operations by setting up a point of time when a word line man be disabled in accordance with in response to the frequency information corresponding to the detected frequency of the clock signal.

The synchronous semiconductor memory device of the present invention includes a state control circuit for setting up operation states, an address buffer for buffering an inputted address, and a mode register for setting up an operation mode in response to an output signal of the state control circuit and the address of the address buffer. The synchronous semiconductor memory device also includes a frequency information generating circuit and a driving circuit. The frequency information generating circuit detects a frequency of the clock signal in response to the output signal of the state control circuit and the address of the address buffer, and generates frequency information from the frequency of the clock signal. The driving circuit activates a word line in accordance with the output signal of the state control circuit, the output signal of the mode register, and the frequency information of the frequency information generating circuit.

BRIEF DESCRIPTION OF THE DRAWINGS

The present invention will be more clearly understood from the following description with reference to the accompanying drawings, wherein.

DESCRIPTION OF THE PREFERRED EMBODIMENT

Referring to FIGS. 1 to 4, embodiments of the present invention will be described below.

Figure 1:
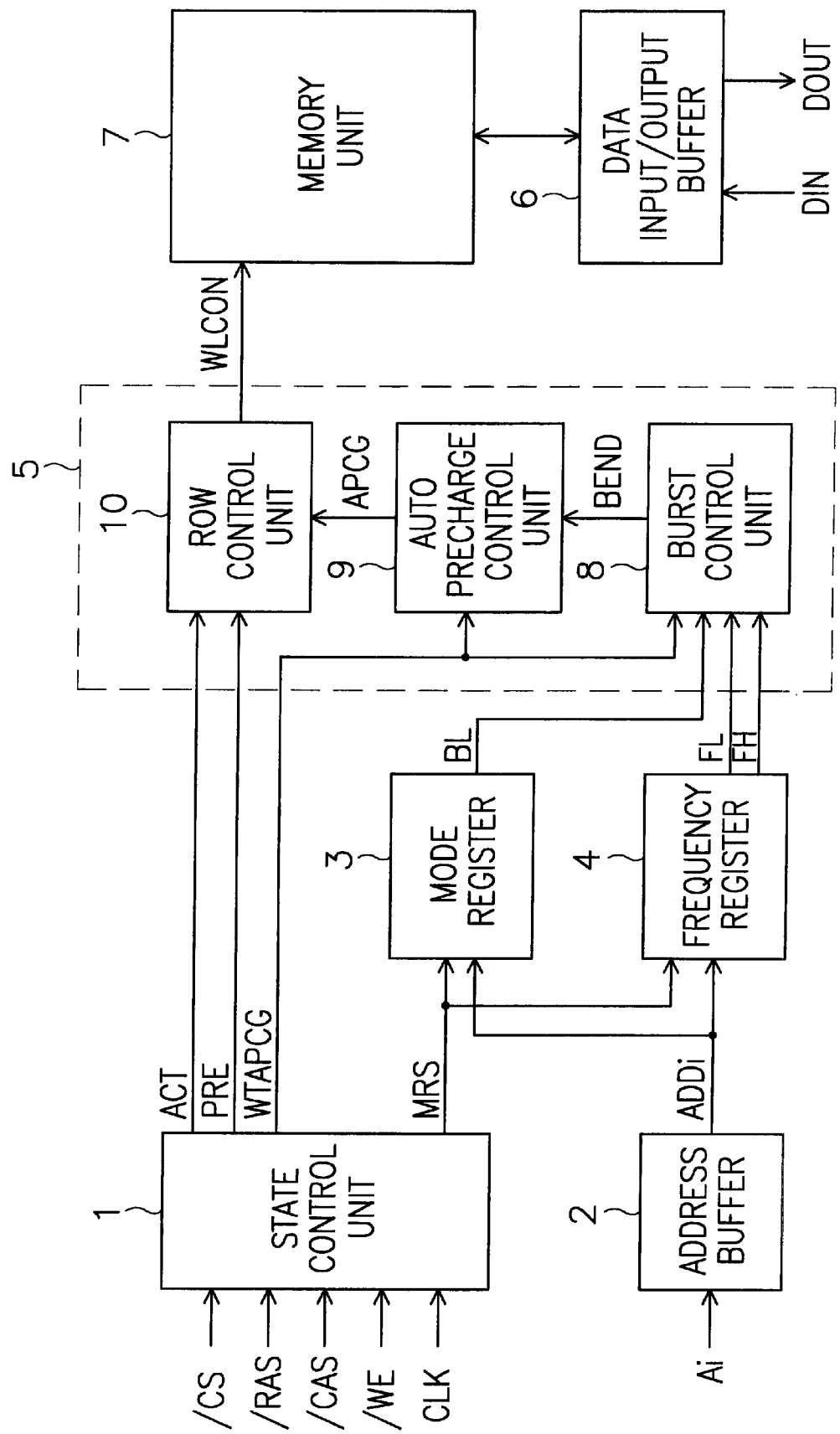
FIG. 1 is a block diagram illustrating a preferred embodiment of a synchronous semiconductor memory device in accordance with the present invention.

FIG. 1 is a block diagram illustrating an embodiment of a synchronous semiconductor memory device in accordance with the present invention. As shown in FIG. 1, the synchronous semiconductor memory device includes a state control unit 1 for setting up an operation state, an address buffer 2 for receiving and buffering an address Ai, a mode register 3 for setting up an operation mode in response to a mode register set signal MRS from the state control unit 1 and an internal address ADDi from the address buffer 2, a frequency register 4 for outputting frequency information of an inputted clock signal CLK, a driving unit 5 for activating a word line, a data input/output buffer 6 for buffering an input data DIN and an output data DOUT, and a memory unit 7 for storing the input data DIN through the data input/output buffer 6 and generating the output data DOUT therefrom.

The state control unit 1 receives an external clock signal CLK, a chip selection signal /CS, a write enable signal /WE, a row address strobe signal /RAS, and a column address strobe signal /CAS, outputs a word line enable command signal ACT, a precharge command signal PRE, an auto precharge control signal WTAPCG, and a mode register set signal MRS, resulting in setting states of the cell operations in accordance with combination of these outputted signals.

The frequency register 4 outputs a low frequency control signal FL and a high frequency control signal FH for the external clock signal CLK supplied from an external source thereto. Here, the low frequency control signal FL and the high frequency control signal FH contain the frequency information of the external clock signal CLK.

The high frequency control signal FH is enabled when the external clock signal CLK is of high frequency, and the low frequency control signal FL is enabled when the external clock signal CLK is of low frequency. Here, the high frequency control signal FH and the low frequency control signal FL are flag signals. For example, it is assumed that the low frequency is 133 MHz, and the high frequency is 166 MHz. If the synchronous semiconductor memory device operates at 133 MHz, the low frequency control signal FL is enabled. On the contrary, if the memory device operates at 166 MHz, the high frequency control signal FH is enabled.

If the external clock signal CLK used in the memory device has various frequencies, frequency information about each frequency can be obtained. That is, if the synchronous semiconductor memory device operates at 100 MHz, 133 MHz, and 166 MHz, plenty of frequency information about each frequency is generated, and this information is utilized in the form of a flag signal.

In accordance with another embodiment, a low frequency control signal FL and a high frequency control signal FH may be generated from an internal clock signal generated from the external clock signal CLK, but not the extend clock signal CLK itself.

Also, the state control unit 1 may generate another control signal corresponding to the mode register set signal MRS, for controlling the mode register 3 and the frequency register 4. For an example that the synchronous semiconductor memory device of the present invention is a DDR SDRAM (Double Data Rate Synchronous DRAM), the frequency register 4 can be controlled by EMRS (Extended MRS) instead of the mode register set signal MRS.

The driving unit 5 includes a burst control unit 8, an auto precharge control unit 9, and a row control unit 10. The burst control unit 8 which is controlled by the auto precharge control signal WTAPCG of the state control unit 1, outputs the burst end command signal BEND in response to the burst length signal BL of the mode register 3, the low frequency control signal FL, and high frequency control signal FH of the frequency register 4. The auto precharge control unit 9 which is controlled by the WTAPCG of the state control unit 1, generates the auto precharge command signal APCG in response to the burst end command signal BEND of the burst control unit 8, and the row control unit 10 is controlled by the word line enable command signal ACT and the precharge command signal PRE, and enables/disables and precharges a word line in response to the auto precharge command signal APCG.

The burst control unit 8 has some parameters for performing operations. A value of each parameter when the low frequency control signal FL of the frequency register 4 is enabled is different from that in case that the high frequency register signal FH is enabled. The burst control unit 8 generates the burst end command signal BEND in response to the burst length signal BL of the mode register 3 after data as many as the burst length are inputted in sequence.

For example, a parameter tDAL represents a time interval between the input of the word line enable command signal ACT and the input of a last data in response to a command signal WTA requesting the auto precharge after the write-in operation. The parameter tDAL is established to 3 clocks, when the low frequency control signal FL is enable and when the high frequency control signal FH is enabled. Further, a parameter tRDL which represent is a time interval between input of the last data and the beginning of a row address precharge operation is established to 1 clock, when the FL is enabled but 2 clocks when the FH is enabled, respectively. Since the burst control unit 8 includes a burst counter (not shown), the above operation is performed by controlling the number of clock by the burst counter.

In accordance with another embodiment, the burst control unit 8 may include a delay circuit (not shown). In this case, while the burst end command signal BEND may be generated without delay when the low frequency control signal FL of the frequency register 4 is enabled, the burst 5 end command signal BEND, when the high frequency control signal FH is enabled, may be delayed by the delay circuit and the generated after the cell node is charged enough.

In accordance with another embodiment, the burst control unit 8 may be constituted by a control circuit (not shown). In this case, the burst end command signal BEND may be established so as to be generated early when the low frequency control signal FL of the frequency register 4 is enabled, and may be established so as to be generated lately when the high frequency control signal FH is enabled.

The auto precharge control unit 9 generates the auto precharge command signal APCG, in response to an auto precharge control signal WRAPCG of the state control unit 1 and the burst end command signal BEND of the burst control unit 8.

The row control unit 10 enable/disables and precharges the word line in response to the word line enable command signal ACT of the state control unit 1 and the precharge command signal PRE, under a control of the auto precharge command signal APCG of the auto precharge control unit 9.

Figure 2A:
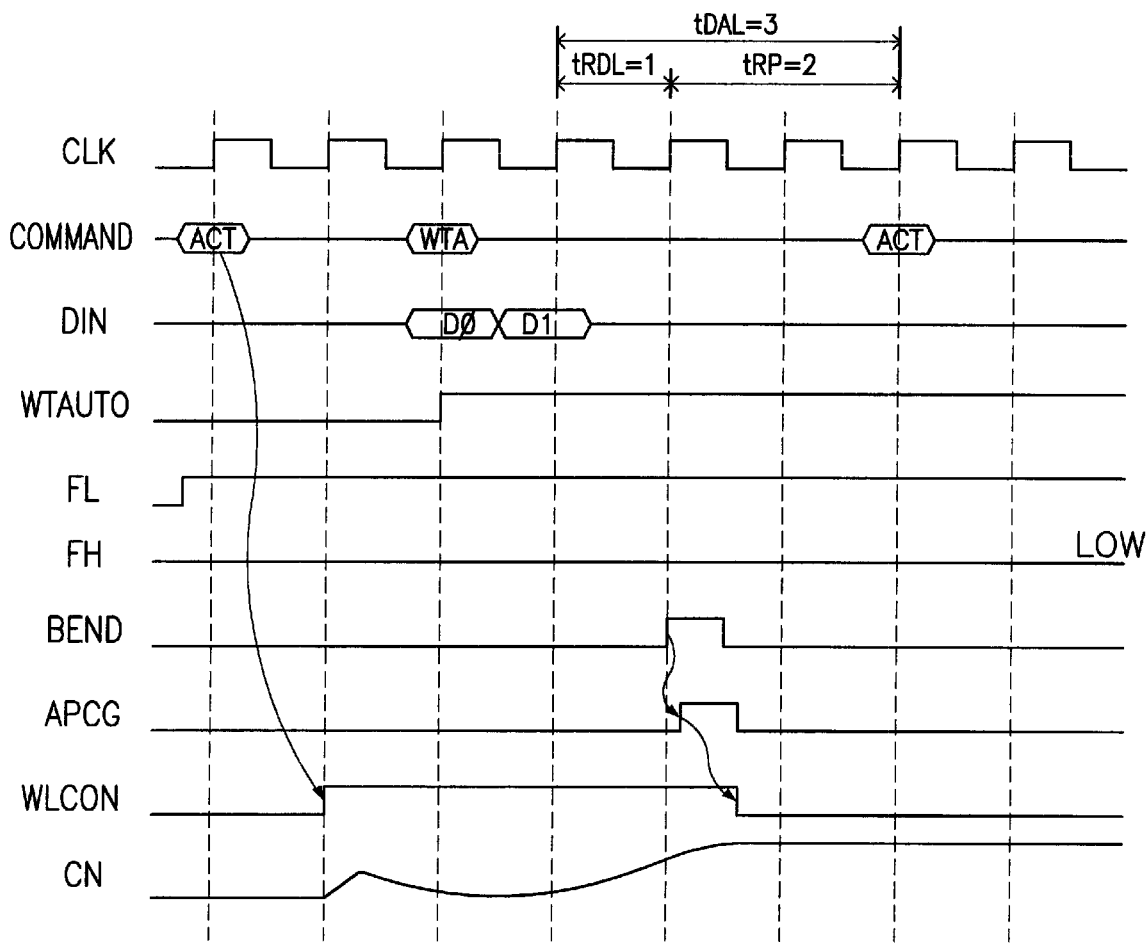
FIG. 2A is a timing diagram illustrating an operation of a low frequency clock signal in FIG. 1.
Figure 2B:
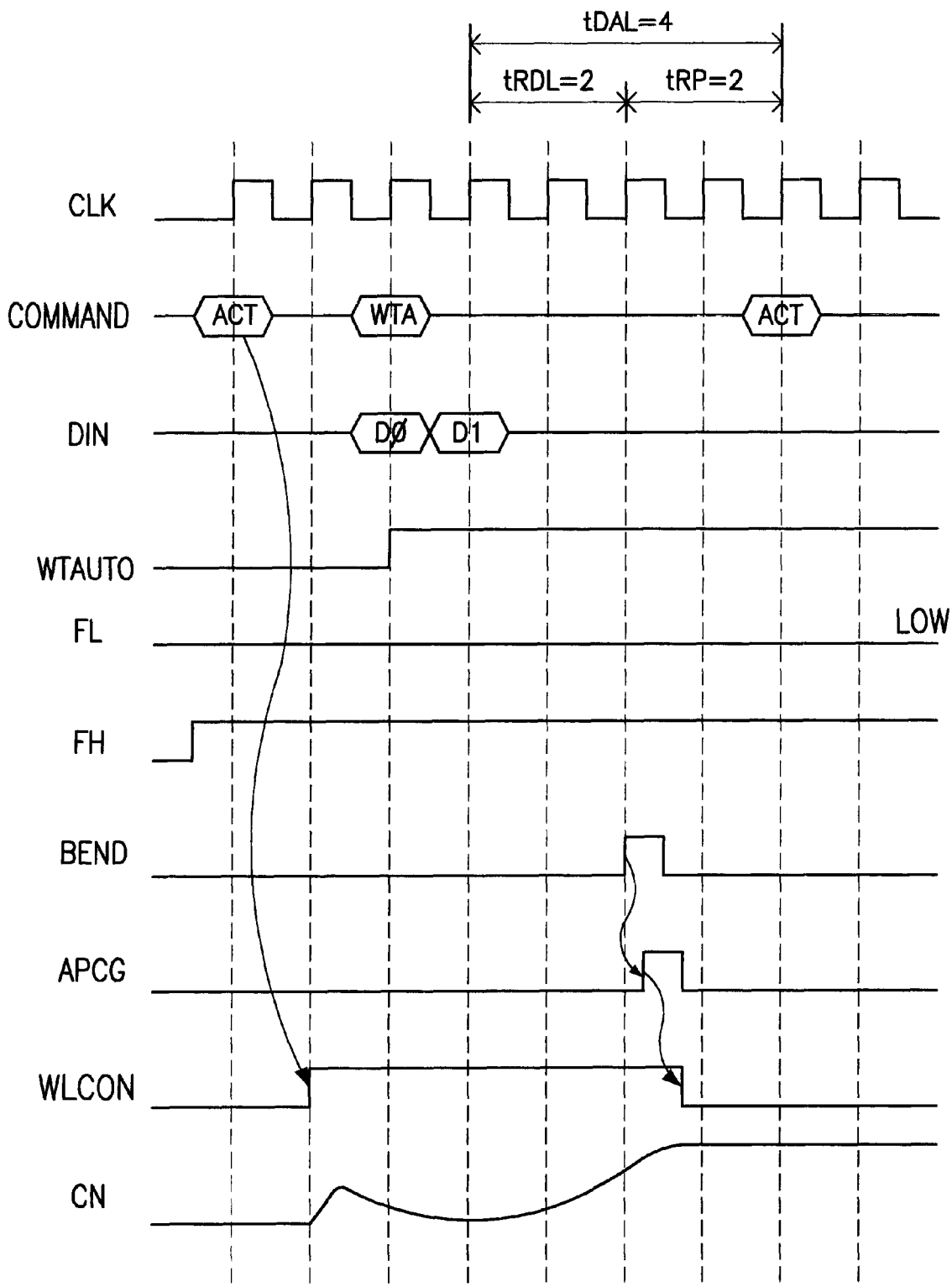
FIG. 2B is a timing diagram illustrating an operation of a high frequency clock signal in FIG. 1.

FIGS. 2A and 2B are timing diagrams illustrating an embodiment of the synchronous semiconductor memory device in accordance with the present invention. The embodiment is applied when the burst control unit 5 including the burst counter (not shown) generates the burst end command signal BEND by setting the parameter tDAL differently.

FIG. 2A is a timing diagram illustrating the synchronous semiconductor memory device of the present invention when an external clock signal CLK of low frequency is inputted. If the low frequency clock signal CLK is supplied, the low frequency control signal FL is enabled.

If the low frequency control signal FL is enabled, the parameter tDAL is established to 3 clocks. That is, the parameter tRDL is established to 1 clock, and a parameter tRP is established to 2 clocks, the parameter tRP represents a row precharge operation time.

The auto precharge control signal WTAPCG is enabled in accordance with the command signal WTA which represents a signal of controlling the auto precharge operation after write-in operation is completed. And than, at a first rising edge of the external clock signal CLK after the last data DIN is inputted, the burst control unit 8 generates the burst end command signal BEND.

The auto precharge control unit 9 generates the auto precharge command signal APCG in response to the burst end command signal BEND when the burst end command signal BEND is activated.

The row control unit 10 generates a word line control signal WLCON in response to the auto precharge command signal APCG of the auto precharge control unit 9, and thereby the word line is disabled and precharged.

Meanwhile, FIG. 2B is a timing diagram illustrating the operation of the synchronous semiconductor memory device of the present invention when an external clock signal CLK of high frequency is inputted. If the high frequency clock signal CLK is inputted, a high frequency control signal FH is enabled.

Here, if the high frequency control signal FH is enabled, the parameter tDAL is established as 4 clocks. That is, the parameter tRDL is established to 2 clocks, and a parameter tRP is established as 2 clocks.

At a second rising edge of the external clock signal CLK after the last data DIN is inputted, the burst control unit 5 generates the burst end command signal.

If the burst end command signal BEND is activated, the auto precharge control unit 9 generates the auto precharge command signal APCG in response to the burst end command signal BEND.

The row control unit 10 generates the word line control signal WLCON in response to the auto precharge command signal APCG, and thereby a word line is disabled and precharged.

As the present invention use a method of setting the parameter tDAL differently for each case, the external clock signal CLK has low frequency or high frequency, with taking account into the cases that the word line is disabled after the cell node CN is charged enough even though the high frequency clock signal is inputted. Thus, it is possible to prevent failing of a read-out or a write-in operation.

For example, in the synchronous semiconductor memory device operating in synchronously response to the external clock signal CLK having frequencies of 133 MHz and 166 MHz, the clock signal CLK having the frequency of 133 MHz is regarded as a low frequency, and the clock signal CLK of 166 MHz is regarded as a high frequency. When the clock signal CLK of 133 MHz is inputted, the low frequency control signal FL is enabled. Thus, the parameter tDAL is established as 3 clocks which represents a time taken from inputting the last data to activating the word line enable command signal ACT by the command signal WTA. When the CLK of 166 MHz is inputted, the high frequency control signal FH is enabled, and thereby the tDAL is established to 4 clocks.

When the clock signal CLK of 166 MHz is inputted, if the parameter tDAL is established to 3 clocks, it may fail the read-out or write-in operation because the precharge operation is performed before the cell node CN is charged enough. However, in case of the present invention, when the clock signal CLK of 166 MHz is inputted, since the parameter tDAL is established to 4 clocks, there may be no failure in the read-out or write-in operation because the precharge operation is performed after the cell node CN is charged enough.

Figure 3:
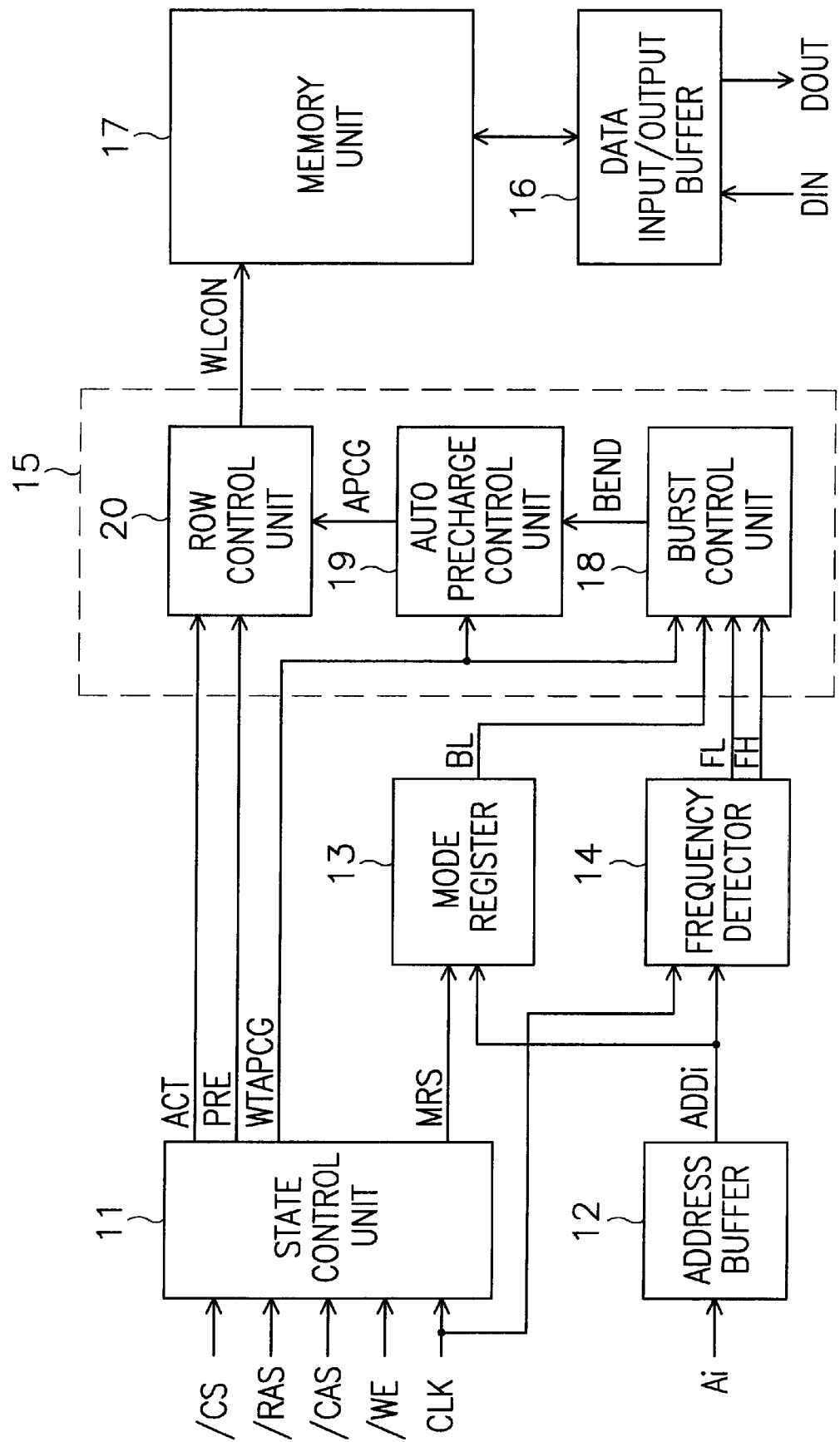
FIG. 3 is a block diagram illustrating another embodiment of a synchronous semiconductor memory device in accordance with the present invention.

FIG. 3 is a block diagram illustrating another embodiment of the synchronous semiconductor memory device in accordance to the present invention. As shown in FIG. 3, the memory device includes a state control unit 11, an address buffer 12, a mode register 13, a driving unit 15, a data input/output buffer 16, and a memory unit 17. The driving unit 15 includes a burst control unit 18, an auto precharge control unit 19, and a row control unit 20.

A difference of the present embodiment from the embodiments described above is that the present embodiment use a frequency detector 14 in behalf of the frequency register 4. The frequency detector 14 detects a frequency of the inputted external clock signal CLK, and outputs the low frequency control signal FL and the high frequency control signal FH corresponding to the detected result. Here, there may be plenty of frequency information in accordance with the number of frequency to be used.

For example, in the memory device operating in synchronously response to the external clock signal CLK having frequencies of 133 MHz and 166 MHz, it is assumed that the external clock signal CLK of 133 MHz is a low frequency and the external clock signal CLK of 166 MHz is a high frequency. When the external clock signal CLK of 133 MHz is inputted, the low frequency control signal FL is enabled. When the CLK of 166 MHz is inputted, the high frequency control signal FH is enabled.

Here, the frequency detector 14 can detect the frequency of an internal clock signal generated by the external clock signal CLK, and can output the low frequency control signal FL and the high frequency control signal FH corresponding to the detected result.

Since the following operation in accordance with the low frequency control signal FL and high frequency control signal FH is the same with the above embodiment, it will be not described in detail.

Figure 4:
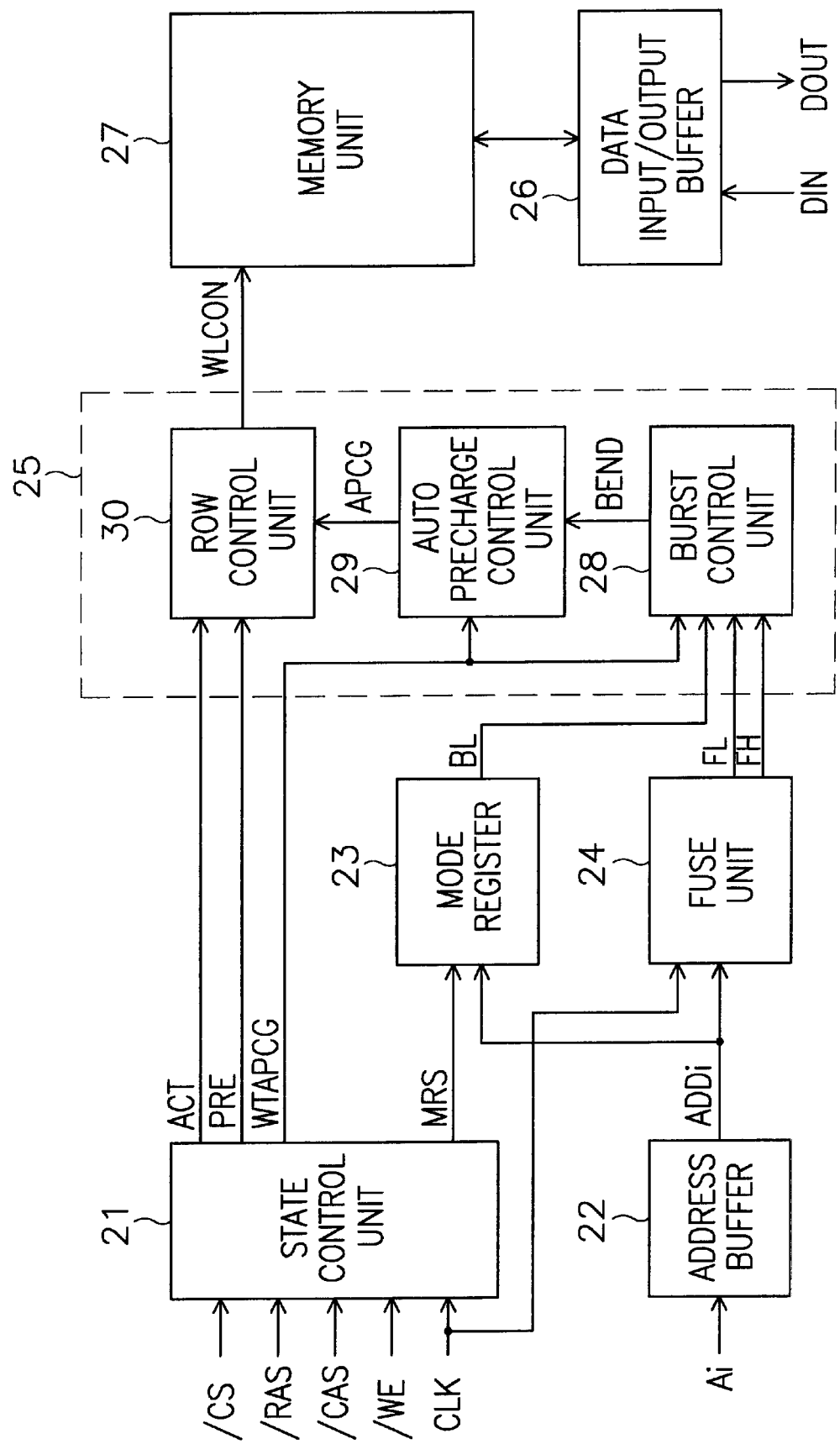
FIG. 4 is a block diagram illustrating the other embodiment of a synchronous semiconductor memory device in accordance with the present invention.

FIG. 4 is a block diagram showing the other embodiment of the synchronous semiconductor memory device in accordance with the present invention. As shown in FIG. 4, similar to above embodiments, the memory device includes a state control unit 21, an address buffer 22, a mode register 23, a driving unit 25, a data input/output buffer 26, and a memory unit 27. The driving unit 25 includes a burst control unit 28, an auto precharge control unit 29, and a row address control unit 30.

The present embodiment use a fuse unit 24 in behalf of the frequency register 4. The fuse unit 24 detects a frequency of the inputted external clock signal CLK, and cuts off a fuse corresponding to the detected result, so that outputs the low frequency control signal FL and the high frequency control signal FH as frequency information.

For example, when the semiconductor memory device operates in synchronously response to the external clock signal CLK having the frequencies of 133 MHz and 166 MHz, it is assumed that the external clock signal CLK of 133 MHz is a low frequency and the external clock signal CLK of 166 MHz is a high frequency. If the external clock signal CLK of 133 MHz is inputted, a fuse corresponding to the low frequency is cut off, so that the low frequency control signal FL is enabled, if the external clock signal CLK of 166 MHz is inputted, a fuse corresponding to the high frequency is cut off, so that the high frequency control signal FH is enabled.

Here, the fuse unit 24 may cut off a fuse in accordance with the result detected by the frequency of the internal clock signal generated by external clock signal CLK.

Since the following operation in accordance with the FL and FH is the same with the above embodiment, it will be not described in detail.

As the above, the synchronous semiconductor memory device of the present invention provides frequency information of a synchronized clock signal to a memory device. With the information, the memory device establishes a point of time to disable a word line, so that it can promote the efficiency of cell operations in the synchronous semiconductor memory o device.

Further, the memory device of the present invention detects a frequency of a synchronized clock signal, and supplies the frequency information about the detected result, so that the memory device can be established in response to the information a point of time to disable a word line. It can also promote the efficiency of cell operations in the synchronous semiconductor memory device.

While the invention has been described in conjunction with specific embodiments thereof, it is evident that many alterations, modifications, and variations will be apparent to those skilled in the art in light of the foregoing description. Accordingly, it is intended to embrace all such alterations, modifications, and variations in the appended claims.

What is claimed is:

1. A synchronous semiconductor memory device comprising:

a state control circuit producing output signals for setting operation states;

an address buffer for buffering an inputted address;

a mode register producing output signals for setting operation modes in response to an output signal from said state control circuit and an inputted address from said address buffer;

a frequency information generating circuit for outputting frequency information corresponding to frequency of a clock signal in response to the output signal from said state control circuit and the inputted address from said address buffer; and a driving circuit for activating a word line in response to the output signal from the state control circuit, an output signal from the mode register, and in accordance with the frequency information from the frequency information generating circuit.

2. The memory device of claim 1, wherein said driving circuit includes:

a burst length control circuit for generating a burst end command signal in response to the output signals of the state control circuit and the output signals of the mode register by using the frequency information of the frequency information generating circuit;

an auto precharge operation control circuit for generating an auto precharge operation command signal in response to the burst length end command signal of the burst length control circuit and an output signal of the state control circuit; and a row control circuit for activating a word line, wherein the burst length end command signal indicates an end of the burst length and the auto precharge operation command signal controls auto precharge operation.

3. The memory device of claim 2, wherein said burst length control circuit includes a burst length counter for counting the number of clocks of the clock signal and for controlling a point of time to generate the burst length end command signal.

4. The memory device of claim 2, wherein said burst length control circuit includes a delay circuit for delaying the point of time to generate the burst length end command signal by delaying the clock signal.

5. The memory device of claim 2, wherein said burst length control circuit includes a pulse width adjusting circuit for controlling the point of time to generate the burst lenght end command signal by adjusting the pulse width of the clock signal.

6. The memory device of claim 1, wherein said frequency information generating circuit includes means for storing the frequency information corresponding to the frequency of the clock signal.

7. The memory device of claim 1, wherein said frequency information generating circuit includes means for detecting a frequency of the clock signal, and means for outputting the frequency information corresponding to the detected result.

8. The memory device of claim 1, wherein said frequency information generating circuit includes:
   a plurality of fuses;
   means for cutting off the fuse corresponding to the frequency of the clock signal; and
   means for outputting information of the fuse-cutting as the frequency information.

9. The memory device of claim 1, wherein said clock signal is an external clock signal supplied from an external source.

10. The memory device of claim 1, wherein said clock signal is an internal clock signal generated by an external clock signal.

11. A synchronous semiconductor memory device comprising:
   a state control circuit producing output signals for setting operation states;
   an address buffer for buffering an inputted address;
   a mode register producing output signals for setting operation modes in response to an output signal from said state control circuit and an inputted address from said address buffer;
   a frequency information generating circuit including means for detecting a frequency of a clock signal and means for outputting the frequency information corresponding to the detected frequency in response to the output signal from said state control circuit and the inputted address from said address buffer; and
   a driving circuit for activating a word line in accordance with the output signal from the state control circuit, an output signal from the mode register, and the frequency information from the frequency information generating circuit.

12. A synchronous semiconductor memory device comprising:
   a state control circuit producing output signals for setting operation states;
   an address buffer for buffering an inputted address;
   a mode register producing output signals for setting operation modes in response to an output signal from said state control circuit and an inputted address from said address buffer;
   a frequency information generating circuit for detecting and outputting frequency information of a clock signal in response to the output signal of said state control circuit and the inputted address of said address buffer, said frequency information generating circuit including means for cutting off a fuse corresponding to a frequency of the clock signal and for outputting information of the fuse-cutting as the frequency information; and
   a driving circuit for activating a word line in accordance with the output signal of the state control circuit, an output signal of the mode register, and the frequency information of the frequency information generating circuit.

* * * * *